United States Patent
Nishiyama

(10) Patent No.: US 8,148,698 B2
(45) Date of Patent: Apr. 3, 2012

(54) CHARGED PARTICLE BEAM WRITING APPARATUS

(75) Inventor: Tetsurou Nishiyama, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 149 days.

(21) Appl. No.: 12/714,735

(22) Filed: Mar. 1, 2010

(65) Prior Publication Data
US 2010/0237261 A1    Sep. 23, 2010

(30) Foreign Application Priority Data
Mar. 23, 2009 (JP) ................................. 2009-069566

(51) Int. Cl.
*H01J 37/147* (2006.01)
(52) U.S. Cl. .................................................. 250/396 R
(58) Field of Classification Search .............. 250/396 R, 250/492.22
See application file for complete search history.

(56) References Cited

U.S. PATENT DOCUMENTS

| | | | | |
|---|---|---|---|---|
| 4,661,709 A * | 4/1987 | Walker et al. | ............. | 250/396 R |
| 4,736,139 A * | 4/1988 | Tomii et al. | ................... | 315/366 |
| 6,268,606 B1 | 7/2001 | Abe et al. | | |
| 7,554,095 B2 * | 6/2009 | Fuse et al. | ................. | 250/396 R |

FOREIGN PATENT DOCUMENTS

JP    2007-157742    6/2007

* cited by examiner

*Primary Examiner* — Kiet T Nguyen
(74) *Attorney, Agent, or Firm* — Oblon, Spivak, McClelland, Maier & Neustadt, L.L.P.

(57) ABSTRACT

A blanking deflector 23 is of the coaxial type and includes a rod-like inner electrode 231 and a cylindrical outer electrode 232 enclosing the inner electrode 231 such that an air gap through which the charged particle beam B passes is formed between the inner and outer electrodes 231 and 232. The inner electrode 231 and the outer electrode 232 are formed by forming electrode films 231b and 232b of a metal over the surfaces of nonconducting base materials 231a and 232a, respectively, by vacuum deposition or sputtering. Further, each of the shaping deflector and the main deflector and sub-deflector for beam scanning includes a plurality of pairs of opposite electrodes, and each opposite electrode is formed by forming an electrode film of a metal over the surface of a nonconducting base material by vacuum deposition or sputtering.

2 Claims, 3 Drawing Sheets

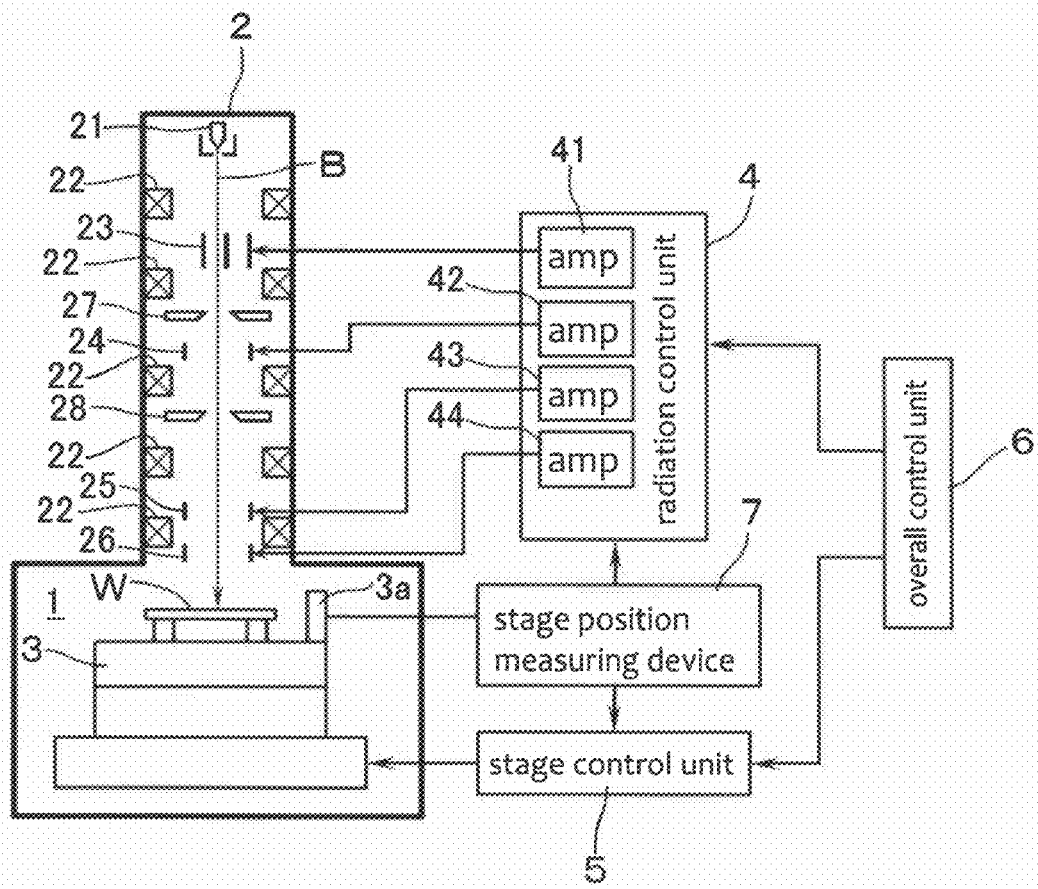

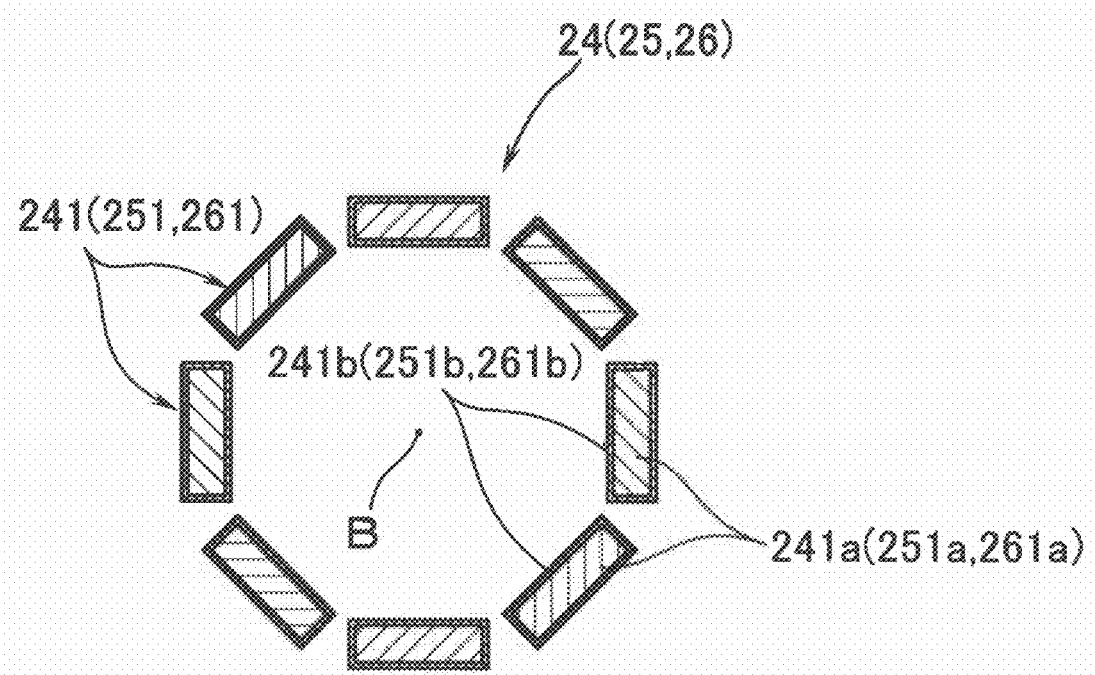

CHARGED PARTICLE BEAM WRITING APPARATUS

BACKGROUND OF THE INVENTION

1. Field of the Invention

The present invention relates to a charged particle beam writing apparatus which includes a stage for mounting a workpiece thereon and beam irradiating unit configured to irradiate with a charged particle beam and which writes a predetermined pattern on the workpiece by irradiating the workpiece with the charged particle beam from the beam irradiating unit.

2. Background Art

The beam irradiating unit in charged particle beam writing apparatuses includes a blanking deflector for selectively allowing or preventing irradiation of the workpiece with a charged particle beam, a shaping deflector for shaping the cross section of the charged particle beam into a predetermined shape, and a main deflector and a sub-deflector for scanning the charged particle beam over the workpiece (see, e.g., Japanese Laid-Open Patent Publication No. 2007-157742). When writing on the workpiece, a write operation is performed on each frame region defined on the workpiece while the stage is being moved, where the frame regions have a strip shape corresponding to the deflection width of the main deflector with respect to the charged particle beam. It should be noted that each frame region is divided into a number of sub-field regions arranged in a matrix fashion. When writing on a frame region, the charged particle beam is positioned at each sub-field region in the frame region by the main deflector and then scanned to each writing position in the sub-field region by the sub-deflector while the irradiation of the workpiece with the charged particle beam is intermittently prevented by the blanking deflector. At that time, the charged particle beam is shaped into a predetermined shape for each writing position by the shaping deflector to write the desired pattern on each sub-field region by irradiating the workpiece with the charged particle beam at each writing position.

It should be noted that the blanking deflector includes a pair of opposite electrodes facing each other across an air gap through which the charged particle beam passes. Further, each of the shaping deflector and the main and sub-deflectors for beam scanning includes a plurality of pairs of opposite electrodes, the opposite electrodes of each pair facing each other across the air gas through which the charged particle beam passes. These opposite electrodes are generally made of a pure metal material. When a high frequency voltage (e.g., 1 GHz) is applied to such opposite electrodes, an eddy current is generated in the electrodes. The magnetic field resulting from the eddy current causes undesirable variation in the deflection angle and direction of the charged particle beam (referred to as "beam drift"), thus lowering the deflection accuracy.

Further, in the blanking deflector, if the distance between the signal line and the ground line is not constant, the resulting characteristic impedance may not be matched to that of the opposite electrodes. Further, the characteristic impedance varies with the frequency of the applied signal. It should be noted that the voltage applied to the opposite electrodes is maximized when the characteristic impedance of the opposite electrodes is equal to that of the cable transmitting the voltage signal to the opposite electrodes, since impedance matching is effected. When their characteristic impedances are not matched, signal reflection, etc. occurs where the signal encounters an impedance change, thereby decreasing the voltage applied to the opposite electrodes. This means that the actual voltage applied between the opposite electrodes varies with the frequency of the applied voltage signal, and as a result, the deflection accuracy is degraded at high frequencies, e.g., 1 GHz.

SUMMARY OF THE INVENTION

The present invention has been made in view of the above problems. It is, therefore, an object of the present invention to provide a charged particle beam writing apparatus constructed to prevent degradation of the deflection accuracy at high frequencies and thereby improve the writing accuracy.

According to one aspect of the present invention, a charged particle beam writing apparatus comprises a stage on which a workpiece is mounted and beam irradiating unit configured to irradiate with a charged particle beam. The charged particle beam writing apparatus is adapted to write a predetermined pattern on the workpiece mounted on the stage by irradiating the workpiece with the charged particle beam from the beam irradiating unit. The beam irradiating unit includes a blanking deflector for selectively allowing or preventing the irradiation of the workpiece with the charged particle beam, a shaping deflector for shaping the cross section of the charged particle beam into a predetermined shape, and a main deflector and a sub-deflector for scanning the charged particle beam over the workpiece. The blanking deflector includes a rod-like inner electrode and a cylindrical outer electrode enclosing the inner electrode such that an air gap through which the charged particle beam passes is formed between the inner and outer electrodes. Each of the inner and outer electrodes is formed by forming an electrode film of a metal over the surface of a nonconducting base material by vacuum deposition or sputtering.

According to another aspect of the present invention, a charged particle beam writing apparatus comprises a stage on which a workpiece is mounted and beam irradiating unit configured to irradiate with a charged particle beam. The charged particle beam writing apparatus is adapted to write a predetermined pattern on the workpiece mounted on the stage by irradiating the workpiece with the charged particle beam from the beam irradiating unit. The beam irradiating unit includes a blanking deflector for selectively allowing or preventing the irradiation of the workpiece with the charged particle beam, a shaping deflector for shaping the cross section of the charged particle beam into a predetermined shape, and a main deflector and a sub-deflector for scanning the charged particle beam over the workpiece. The shaping deflector includes a plurality of pairs of opposite electrodes, the opposite electrodes of each pair facing each other across an air gap through which the charged particle beam passes. Each opposite electrode is formed by forming an electrode film of a metal over the surface of a nonconducting base material by vacuum deposition or sputtering.

According to other aspect of the present invention, a charged particle beam writing apparatus comprises a stage on which a workpiece is mounted and beam irradiating unit configured to irradiate with a charged particle beam. The charged particle beam writing apparatus is adapted to write a predetermined pattern on the workpiece mounted on the stage by irradiating the workpiece with the charged particle beam from the beam irradiating unit. The beam irradiating unit includes a blanking deflector for selectively allowing or preventing the irradiation of the workpiece with the charged particle beam, a shaping deflector for shaping the cross section of the charged particle beam into a predetermined shape, and a main deflector and a sub-deflector for scanning the charged particle beam over the workpiece. The main deflector or the sub-deflector includes a plurality of pairs of opposite electrodes, the opposite electrodes of each pair facing each other across an air gap through which the charged particle beam passes. Each opposite electrode is formed by forming an electrode film of a metal over the surface of a nonconducting base material by vacuum deposition or sputtering.

BRIEF DESCRIPTION OF THE DRAWINGS

FIG. 1 is a schematic cross-sectional side view of an electron beam writing apparatus which is an example of a charged particle beam writing apparatus of the present invention.

FIG. 3 is a schematic cross-sectional plan view of a shaping deflector used in the present invention.

DETAILED DESCRIPTION OF THE EMBODIMENTS

Figure 2A:
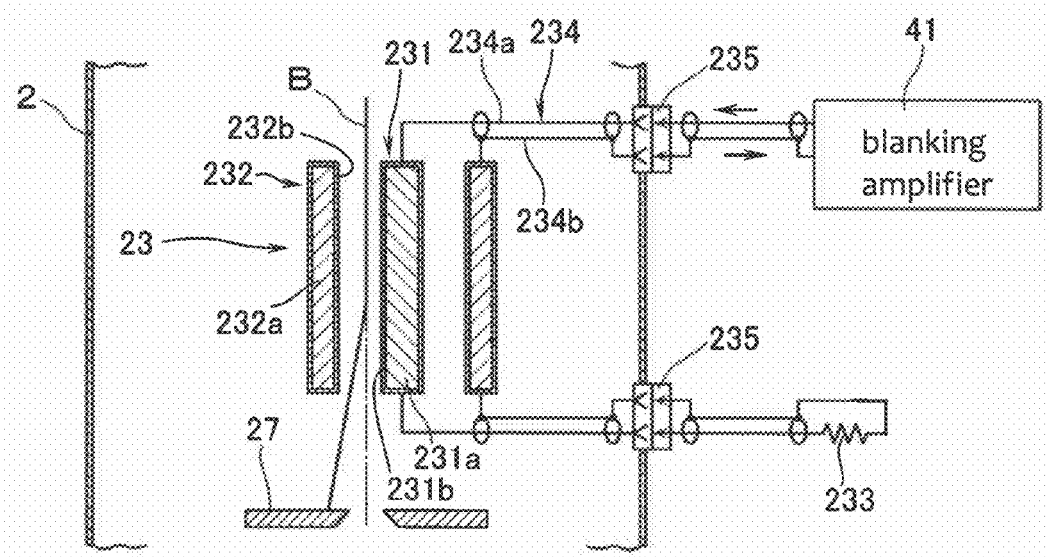
FIG. 2A is a schematic cross-sectional side view of a blanking deflector used in the present invention.

FIG. 1 shows an electron beam writing apparatus which is an example of a charged particle beam writing apparatus of the present invention. This electron beam writing apparatus includes a writing chamber 1 and an electron optical column 2 which is provided on and extends upward from the ceiling portion of the writing chamber 1 and which serves as beam irradiating unit. The writing chamber 1 houses a stage 3 movable in perpendicular X and Y directions, and a workpiece W is mounted on the stage 3. The workpiece W is, for example, a mask in which a light shielding film (a chromium film, etc.) is formed on a glass substrate and a resist film is formed on the light shielding film.

The electron optical column 2 includes an electron gun 21, various lenses 22, a blanking deflector 23, a shaping deflector 24, a sub-deflector 25 and a main deflector 26 for beam scanning, a blanking aperture 27, and a shaping aperture 28. The blanking deflector 23 can be switched between its on and off states. When in its on state, the blanking deflector 23 causes an electron beam B to go straight through the opening of the blanking aperture 27 and impinge on the workpiece W. When in its off state, on the other hand, the blanking deflector 23 deflects the electron beam B to impinge on the blanking aperture 27 outside its opening and thereby prevents irradiation of the workpiece W with the electron beam B. Further, the shaping deflector 24 varies the impinging position of the electron beam B on the shaping aperture 28 so that part of the electron beam B is blocked by an edge or edges of the opening of the shaping aperture 28 to shape the cross section of the beam into a predetermined shape.

The electron optical column 2 is controlled by a radiation control unit 4, and the stage 3 is controlled by a stage control unit 5. The radiation control unit 4 and the stage control unit 5 are both controlled by an overall control unit 6. The radiation control unit 4 includes a blanking amplifier 41 for applying a signal to the blanking deflector 23, a shaping amplifier 42 for applying a signal to the shaping deflector 24, a sub-deflection amplifier 43 for applying a signal to the sub-deflector 25, and a main deflection amplifier 44 for applying a signal to the main deflector 26. The electron beam writing apparatus also includes a stage position measuring device 7 for measuring the X and Y positions of the stage 3. The stage position measuring device 7 includes a laser based measuring device for measuring the position of the stage 3 by using laser light directed to and reflected from a stage mirror 3a fixed to the stage 3.

When writing a pattern on the workpiece W, a write operation is first performed on one of the frame regions defined on the workpiece W while the stage 3 is continuously moved in one of the X and Y directions (e.g., the X direction), where the frame regions have a strip shape corresponding to the deflection width of the main deflector 26 with respect to the electron beam B. Upon completion of the writing on this frame region, the stage 3 is moved one step in the Y direction and then a write operation is performed on the next frame region while the stage 3 is continuously moved in the X direction. This procedure is repeated to write on the entire surface of the workpiece W. It should be noted that each frame region is divided into a number of sub-field regions arranged in a matrix fashion. When writing on a frame region, the electron beam B is positioned at each sub-field region in the frame region by the main deflector 26 and then scanned to each writing position in the sub-field region by sub-deflector 25 while the radiation of the workpiece W with the electron beam B is intermittently prevented by the blanking deflector 23. At that time, the electron beam B is shaped into a predetermined shape for each writing position by the shaping deflector 24 to write the desired pattern on each sub-field region by irradiating the workpiece W with the electron beam B at each writing position.

The blanking deflector 23 is of the coaxial type and includes a rod-like inner electrode 231 and a cylindrical outer electrode 232 enclosing the inner electrode 231 such that an air gap through which the electron beam B passes is formed between the inner and outer electrodes 231 and 232, as shown in FIG. 2A. The inner electrode 231 is electrically connected at its lower end to the lower end of the outer electrode 232 through a resistor 233. The upper ends of the inner electrode 231 and the outer electrode 232 are connected to the blanking amplifier 41 through the central conductor (or signal line) and the shield (or ground line), respectively, of a coaxial cable 234. A current is passed from the inner electrode 231 to the outer electrode 232 through the resistor 233 to deflect the electron beam B. In FIG. 2, reference numeral 235 denotes a connector.

Since the blanking deflector 23 is of the coaxial type, a TEM mode electromagnetic wave propagates between the inner electrode 231 and the outer electrode 232 when the deflector 23 is in operation. Therefore, the phase velocity and the group velocity of the electromagnetic field generated in the deflector 23 are frequency independent, so that the blanking deflector 23 has a constant characteristic impedance independent of the frequency of the applied signal. As a result, the characteristic impedance of the electrodes 231 and 232 can be made equal to the characteristic impedance of the cable 234 at high frequencies.

Figure 2B:
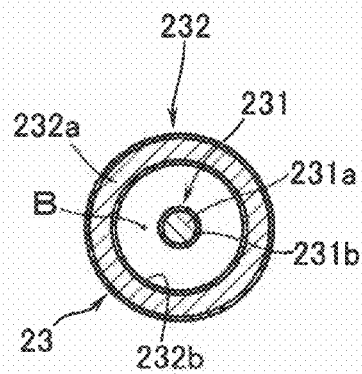
FIG. 2B is a schematic cross-sectional plan view of this blanking deflector.

Further, as shown in FIGS. 2A and 2B, the inner electrode 231 and the outer electrode 232 are formed by forming electrode films 231b and 232b of a metal (e.g., gold) over the surfaces of base materials 231a and 232a, respectively, of a nonconducting material (e.g., ceramic such as alumina) by vacuum deposition or sputtering. Thus since the base materials 231a and 232a of the inner and outer electrodes 231 and 232, respectively, are nonconductive, the generation of an eddy current in these electrodes 231 and 232 is prevented even when a high frequency signal is applied to the electrodes. This feature, together with the impedance matching between the cable and the electrodes as described above, ensures that the deflection accuracy remains high even at high frequencies, e.g., 1 GHz.

Each of the shaping deflector 24, the sub-deflector 25, and the main deflector 26 includes a plurality of pairs of opposite electrodes, the opposite electrodes of each pair facing each other across an air gap through which the electron beam B passes. For example, the shaping deflector 24 includes 4 pairs of opposite electrodes 241, the sub-deflector 25 includes 4 pairs of opposite electrodes 251, and the main deflector 26 includes 4 pairs of opposite electrodes 261, as shown in FIG. 3. The opposite electrodes 241, 251, and 261 are formed by forming electrode films 241b, 251b, and 261b of a metal (e.g., gold) over the surfaces of base materials 241a, 251a, and 261a, respectively, of a nonconducting material (e.g., ceramic such as alumina) by vacuum deposition or sputtering.

Thus since the base materials 241a, 251a, and 261a of the opposite electrodes 241, 251, and 261, respectively, are nonconductive, the generation of an eddy current in these electrodes 241, 251, and 261 is prevented even when a high frequency signal is applied to the electrodes. This prevents degradation of the deflection accuracy at high frequencies, e.g., 1 GHz, thereby improving the writing accuracy.

Incidentally, the electrode films 231b, 232b, 241b, 251b, and 261b may be formed by plating. Such a method, however, is disadvantageous in that the surfaces of the electrode films 231b to 261b could be contaminated with material in the plating solution other than the electrode film material and also could be contaminated during the cleaning process following the plating process. These contaminants act to cause beam drift. According to the present embodiment, on the other hand, since the electrode films 231b to 261b are formed by vacuum deposition or sputtering, these electrode films have clean surfaces without any contaminants, thus effectively preventing beam drift.

It should be noted that if the electrode films 231b to 261b are too thin, their film quality is liable not to be uniform, meaning that some portions of these electrode films have higher resistance than other portions. This prevents the electrode films from fully functioning as conducting films, and as a result, charges are built up, which may result in beam drift. On the other hand, if the electrode films 231b to 261b are too thick, the resulting electrical resistance of these electrode films is low and hence an eddy current is likely to be generated in the films. According to the present embodiment, the electrode films 231b to 261b are made of gold and may have a thickness of approximately 0.2 µm. This allows these electrode films to be formed to have uniform film quality, as well as preventing generation of an eddy current in the films.

While an embodiment of the present invention has been described with reference to the accompanying drawings, it is to be understood that the invention is not limited to this particular embodiment. For example, although in the above embodiment the shaping deflector 24, the sub-deflector 25, and the main deflector 26 each include 4 pairs of opposite electrodes, it will be understood that in other embodiments they may include 3 or 2 pairs of opposite electrodes. Further, although in the above embodiment the present invention is shown as applied to an electron beam writing apparatus, it will be understood that the invention may be applied to writing apparatuses using other charged particle beams such as ion beams.

The features and advantages of the present invention may be summarized as follows.

Thus in the charged particle beam writing apparatus of the first aspect of the present invention, the blanking deflector is of the coaxial type and includes an inner electrode and an outer electrode. This construction allows a TEM mode electromagnetic wave to propagate between these electrodes. Therefore, the phase velocity and the group velocity of the electromagnetic field generated in the deflector are frequency independent, so that the blanking deflector has a constant characteristic impedance independent of the frequency of the applied signal. As a result, the characteristic impedance of the electrodes can be made equal to the characteristic impedance of the cable. Further, since the base materials of the inner and outer electrodes are nonconductive, the generation of an eddy current in these electrodes is prevented even when a high frequency signal is applied to the electrodes. This ensures that the deflection accuracy remains high even at high frequencies.

Further, the base materials of the opposite electrodes in the second to fourth aspects of the present invention are also nonconductive. Therefore, the generation of an eddy current in the opposite electrodes is prevented even when a high frequency signal is applied to the electrodes. This ensures that the deflection accuracy remains high even at high frequencies.

It should be noted that in the charged particle beam writing apparatuses of the first to fourth aspects, the electrode films may be formed by plating. Such a method, however, is disadvantageous in that the surfaces of the electrode films could be contaminated with material in the plating solution other than the electrode film material since the solution contains many such materials. Further, the surfaces of the electrode films also could be contaminated during the cleaning process following the plating process. These contaminants act to cause beam drift. According to the present invention, on the other hand, since the electrode films are formed by vacuum deposition or sputtering, these films have clean surfaces without any contaminants, thus effectively preventing beam drift.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-069566, filed on Mar. 23, 2009 including specification, claims, drawings and summary, on which the Convention priority of the present application is based, are incorporated herein by reference in its entirety.

What is claimed is:

1. A charged particle beam writing apparatus comprising a stage on which a workpiece is mounted and beam irradiating unit configured to irradiate with a charged particle beam, said charged particle beam writing apparatus being adapted to write a predetermined pattern on said workpiece mounted on said stage by irradiating said workpiece with said charged particle beam from said beam irradiating unit, wherein said beam irradiating unit includes a blanking deflector for selectively allowing or preventing said irradiation of said workpiece with said charged particle beam, a shaping deflector for shaping the cross section of said charged particle beam into a predetermined shape, and a main deflector and a sub-deflector for scanning said charged particle beam over said workpiece, wherein said blanking deflector includes a rod-like inner electrode and a outer electrode enclosing said inner electrode such that an air gap through which said charged particle beam passes is formed between said inner and outer electrodes, and wherein each of said inner and outer electrodes is formed by forming an electrode film of a metal over the surface of a nonconducting base material by vacuum deposition or sputtering.

2. The charged particle beam writing apparatus according to claim 1, wherein said electrode film is gold and has a thickness of approximately 0.2 µm.

* * * * *